US005569950A

United States Patent [19]
Lewis et al.

[11] Patent Number: 5,569,950
[45] Date of Patent: Oct. 29, 1996

[54] DEVICE TO MONITOR AND CONTROL THE TEMPERATURE OF ELECTRONIC CHIPS TO ENHANCE RELIABILITY

[75] Inventors: David A. Lewis, Carmel; Chandrasekhar Narayan, Hopewell Junction, both of N.Y.

[73] Assignee: International Business Machines Corporation, Armonk, N.Y.

[21] Appl. No.: 563,510

[22] Filed: Nov. 28, 1995

Related U.S. Application Data

[63] Continuation of Ser. No. 291,222, Aug. 16, 1994, abandoned.

[51] Int. Cl.⁶ .................................................. H01L 31/058
[52] U.S. Cl. .......................... 257/467; 257/712; 257/713; 257/469; 257/930; 361/688; 361/717; 361/718; 361/719
[58] Field of Search ...................... 257/712, 713, 257/467, 469, 470, 930; 361/688, 717, 718, 719

[56] References Cited

U.S. PATENT DOCUMENTS

| | | | |
|---|---|---|---|
| 4,685,081 | 8/1987 | Richman | 257/713 X |
| 4,704,872 | 11/1987 | Jones | 62/3 |
| 5,028,988 | 7/1991 | Porter et al. | 357/81 |
| 5,032,897 | 7/1991 | Mansuria et al. | 257/930 X |
| 5,065,085 | 11/1991 | Aspden et al. | 322/2 R |
| 5,079,618 | 1/1992 | Farnworth | 257/713 |

FOREIGN PATENT DOCUMENTS

| | | | |
|---|---|---|---|
| 61-253842 | 11/1986 | Japan | 257/930 |
| 62-72148 | 4/1987 | Japan | 257/930 |
| 63-224383 | 9/1988 | Japan . | |
| 63-265484 | 11/1988 | Japan . | |
| 5326824 | 12/1993 | Japan . | |

OTHER PUBLICATIONS

No Author, "Thermoelectric Temperature Cycler For Chip Functional Testing," *Research Disclosure*, Mar. 1989, No. 299.
Skobern, "Thermoelectrically Cooled Module," IBM Technical Disclosure Bulletin, vol. 27, No. 1A, Jun. 1984, p. 30.

*Primary Examiner*—William Mintel
*Attorney, Agent, or Firm*—Scully, Scott, Murphy & Presser

[57] ABSTRACT

Device to monitor and control the temperature of electronic chips to enhance reliability including a thermal electric cooling device in which the cold side is thermally secured to the chip and the hot side is attached to a heat sink. A thermocouple is sandwiched between the TEC device and the chip and a feedback control circuit is connected between the thermocouple and the voltage source which applies a potential to the TEC device to maintain the chip at the desired substantially constant temperature.

14 Claims, 2 Drawing Sheets

DEVICE TO MONITOR AND CONTROL THE TEMPERATURE OF ELECTRONIC CHIPS TO ENHANCE RELIABILITY

This is a continuation of application Ser. No. 08/291,222 filed on Aug. 16, 1994, now abandoned.

BACKGROUND OF THE INVENTION

1. Field of the Invention

The present invention relates generally to electronic chip cooling devices and more particularly to a device which will provide active cooling to reduce temperature excursions of electronic chips, which will limit thermal fatigue, increase product life cycle, allow for larger chips and permit chips to be directly attached to substrates with unmatched coefficients of thermal expansion with less reliability concerns.

2. Discussion of the Prior Art

In today's high power PC's and workstations, the number of on/off cycles is limited due to fatigue in the solder interconnections and device wiring because of the high operating temperature of the chip as a result of the high power dissipation. Conventional passive cooling is limited since it relies on a temperature difference between the chip and ambient which is cooled by a fan. Thus, the operating temperature is high, resulting in large temperature excursions between the on and off states. As a consequence of these large temperature excursions that the chips are subjected to, the size of the chip is limited to allow for the required on/off cycles.

In the more recent environmental PC's, power management techniques are being used to conserve power by monitoring system activity and reducing power levels in parts of the system. Thermal cycling is potentially a major concern, since each inactive mode will allow time for the chip to cool. The typical cycling of an environmental PC is represented by curve 1 in FIG. 1, where the normal operating temperature is arbitrarily indicated as 80° C. and the temperature during a sleep cycle is reduced to 70° C. Curve 1 shows that the cycling of such a machine will have a frequency of the order of a few seconds as opposed to the frequency of a normal on/off cycle which is typically one day. Assuming a two second cycle time, on average, this translates to about 15,000 cycles per 8 hour day, with a 10° C. swing. This compares to a total specification of 20,000 on/off cycles for the lifetime of a machine (with a temperature swing of 50° C.). These "mini" cycles can add up to 4 million cycles a year and can pose a serious reliability problem.

Thus, there is a need for a method or structure that can limit either the number of thermal cycles and/or the temperature swings to enhance the product reliability.

SUMMARY OF THE INVENTION

The present invention is directed to the use of a thermal electric cooling (TEC) device in cooperation with a thin film thermocouple to provide active temperature control for an electronic chip to enhance reliability and extend service life. The electronic chip cooling device of the present invention includes attaching the cold side of the TEC device to the electronic chip and attaching a heat sink means to the hot side of the TEC device. A temperature sensing means such as a thermocouple is attached between the TEC device and the chip for sensing the temperature of the chip. A voltage source is coupled to the TEC device and a feedback control circuit means is coupled between the thermocouple and the voltage source. The feedback control circuit controls the level of voltage supplied to the TEC device in response to the temperature of the chip, to maintain the chip at the desired substantially constant temperature.

In the case of systems which have inactive modes of operation such as those proposed for environmental PC's to conserve power, the temperature of the chip can be controlled by the device of the present invention to limit both the number and magnitude of thermal excursions experienced by the chip during operation. For conventional chips, the operating temperature of the chip can be significantly lowered to extend the permissible on-off cycles. Furthermore, the present invention can permit chips to be cooled to a sufficiently low temperature to allow larger chips with a greater distance to neutral point than is currently possible. The present invention also permits chips to be directly attached to the cards even though the coefficient of thermal expansion of the chips to cards are not matched.

DETAILED DESCRIPTION OF THE INVENTION

Figure 2:
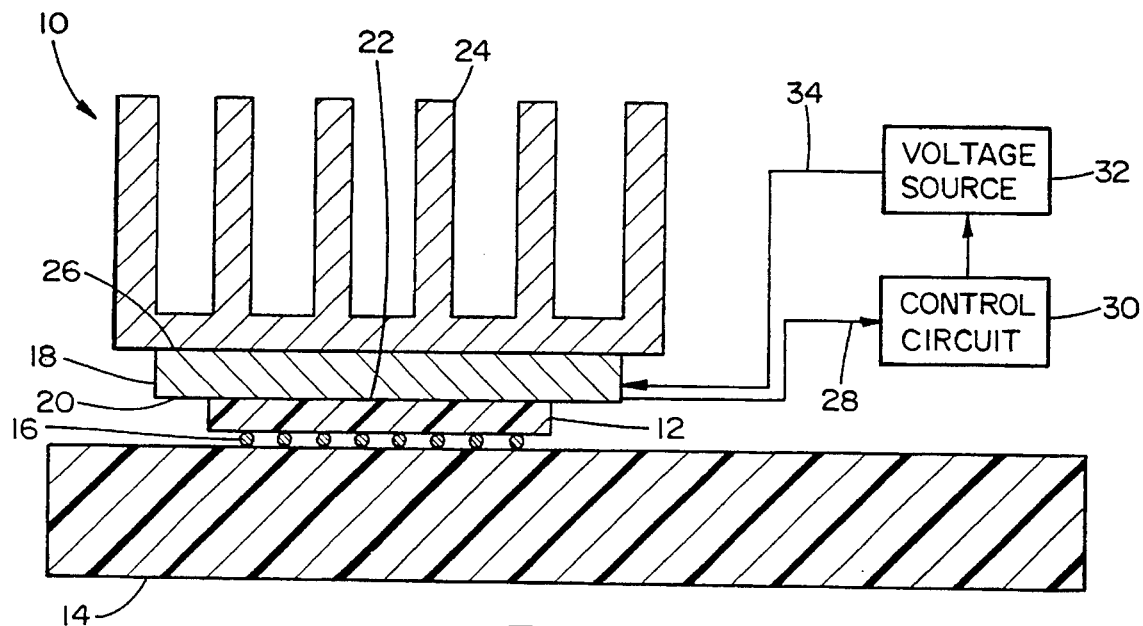
FIG. 2 is a cross-sectional schematic depiction of the electronic chip cooling device of the present invention.

Referring now to FIG. 2, the present invention is directed to an electronic chip cooling device 10 for actively controlling the temperature of a chip. As shown in FIG. 2, electronic chip 12 is attached to substrate 14 by, for example, solder balls 16. A thermal electric cooling device 18 is secured to the exposed surface of chip 12 by the use of any thermally conductive adhesive material. The TEC device 18 is secured to the chip 12 such that the cold side 20 of the device 18 is secured to chip 12. A temperature sensing means such as thin film thermocouple 22 is attached between the cold side 20 of TEC device 18 and chip 12. The temperature sensing means may alternatively be built into the chip or the electronic package adjacent to the interconnection between the TEC device 18 and the chip 12. Heat sink 24 is secured to the hot side 26 of TEC device 18. An output 28 of the thermocouple 22 is coupled to a feedback control circuit 30. The control circuit 30 is coupled to a voltage source 32 which is coupled to an input 34 to the TEC device 18. The input 34 provides a voltage potential between the hot and cold sides of the TEC device 18. Both the control circuit 30 and voltage source 32 may be circuitry that is built into the chip or electronic package or separate extrinsic circuits.

As is well known, a TEC device is comprised of a bimetallic strip that operates under the Peltier effect. The cool side 20 of the TEC device 18 is thermally anchored to the chip 12 and the hot side 26 is sufficiently cooled with the heat sink 24. A voltage potential is applied between the hot and cold sides of the strip and the difference in temperature between the hot and cold sides is directly proportional to the voltage applied to the device.

In operation, the temperature sensing means 22 senses the temperature of the chip 12 and a signal representative of that temperature is coupled to the control circuit 30. The feedback control circuit 30 controls the level of voltage supplied by the voltage source 32 in response to the temperature of the chip. The feedback control circuit 30 is designed to maintain a substantially constant set point temperature by continually adjusting the voltage potential to the TEC device 18 so that the temperature difference between the hot and cold sides 26, 20 remains substantially constant. Control circuits for this purpose are well known and therefore it is not necessary to provide a description thereof.

Figure 1:
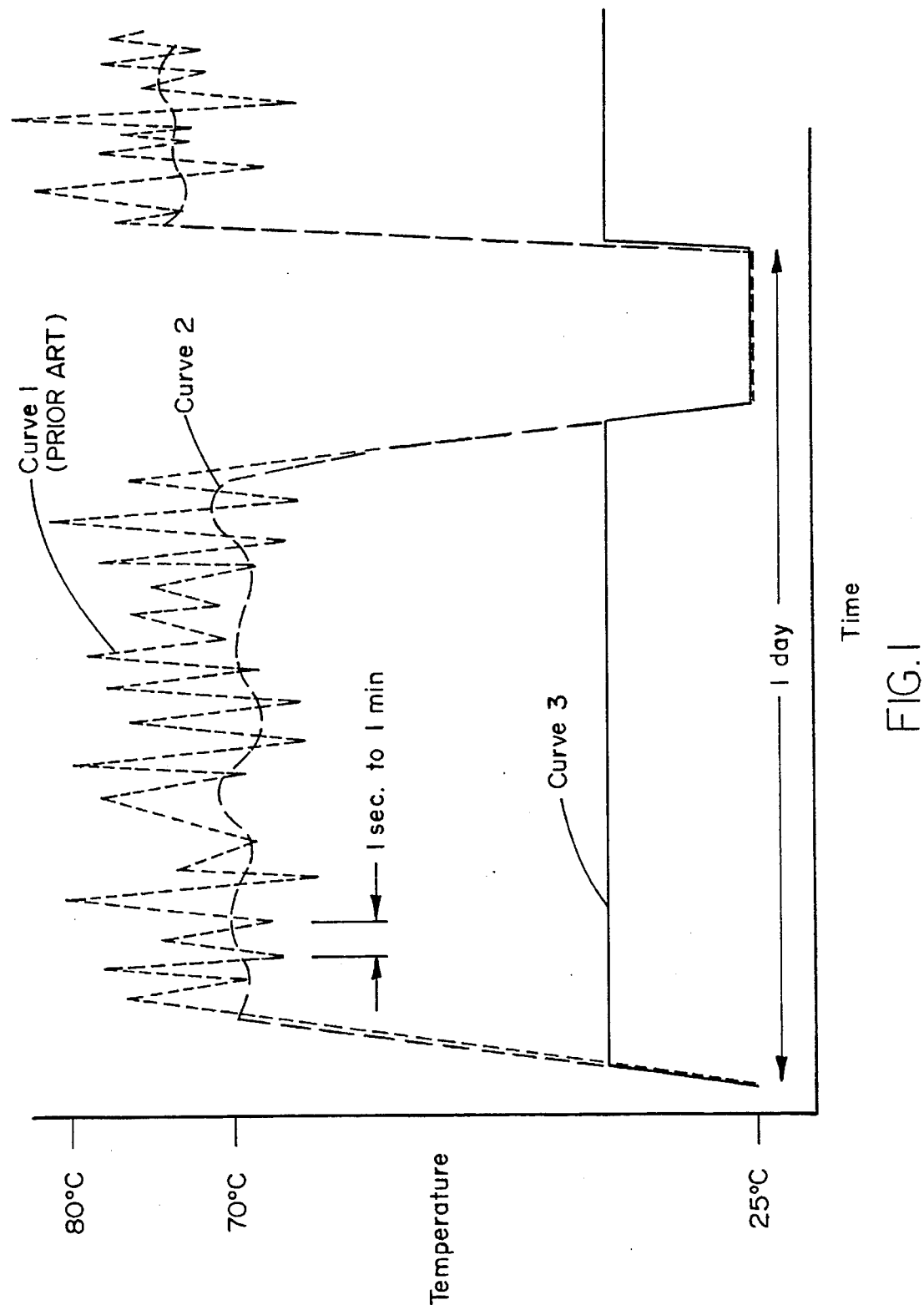
FIG. 1 is a graph having three different time versus temperature curves to compare excursions for prior art cooling devices (curve 1) with cooling provided by the device of the present invention (curves 2 and 3).

The temperature of the chip 12 is actively controlled by the thin film thermocouple 22 being placed adjacent to the chip 12 and being coupled to the feedback control circuit loop to efficiently monitor and control the temperature of the chip to a desired value in real time with a short response time. For example, if the temperature of the chip 12 rises, the thermocouple 22 senses the rise and the control circuit 30 signals the voltage source 32 to apply a voltage to the TEC device 18 to reduce the temperature of the cool side 20 in order to cool the chip 12 back down to the desired temperature. The heat removed from the chip 12 is transferred to the hot side 26 of the TEC device 18 and dissipated through the heat sink 24. Thus, the device 10 of the present invention controls the temperature of the chip to limit both the number and magnitude of thermal excursions experienced by the chip during operation. Curve 2 of FIG. 1 is a time versus temperature plot of the thermal excursions of a chip cooled using the device 10 of the present invention. It can be seen from curve 2 that the temperature of the chip is maintained substantially at 70° C. The temperature changes are much less frequent and of a much less amplitude.

The size and efficiency of the heat sink 24 must also allow for the additional power dissipated by the TEC device 18. As the temperature of the heat sink 24 increases, it becomes more efficient. Using the TEC device 18, the heat sink 24 is decoupled from the temperature of the chip 12. The response time of a heat sink, when attached to a chip, is too slow to allow the effective control of chip temperature. With the present invention, by decoupling the chip temperature from the heat sink temperature, the slow response time can be overcome by the fast response time of the TEC device. A multiple fin metallic heat sink is typical but any configuration or form of heat sink may be used. The power dissipated by the TEC device 18 will be approximately twice the power that is extracted from chip. This additional power consumption can be compensated for by using a larger heat sink or a higher speed fan. This will result in a slightly higher package temperature, but much lower and more uniform chip temperature. In addition, the feedback control circuit 30 can be also coupled to a variable speed fan to provide additional cooling in response to the temperature of the chip.

Furthermore, the device of the present invention can be utilized to provide a substantially lower chip operating temperature to extend the life of the chip. For example, the operating temperature of the chip as depicted by curve 3 of FIG. 1, can be reduced to approximately 35° C. At such a significantly lower temperature, it is possible to permit larger chips to be used than is currently allowable. In addition, actively controlling the temperature of the chip will allow chips to be directly attached to cards even where the coefficient of thermal expansion is not matched.

Thus, the present invention not only provides a device for limiting the operating temperature of a chip, but also to actively control the operating temperature to any desired temperature. The device of the present invention limits temperature excursions of a chip due to power management related inactive cycles. The present invention permits chips to be directly attached to cards even though the coefficient of thermal expansion is not matched. In addition, the present invention provides for the ability to use larger chips in existing configurations without compromising chip service life.

In another embodiment, the structure of the present invention does not require extrinsic temperature and control circuits. For example, the voltage to the TEC device can be preprogrammed to specific values, based on the mode of chip usage or level of activity at that moment. When the chip is in "normal" mode, the control circuit will adjust the voltage to a preset suitable value; when the chip is in sleep mode, the voltage will be adjusted to another preset value sufficient to maintain the desired chip temperature. This simplifies the control circuit configuration as no feedback circuit is required.

Figure 3:
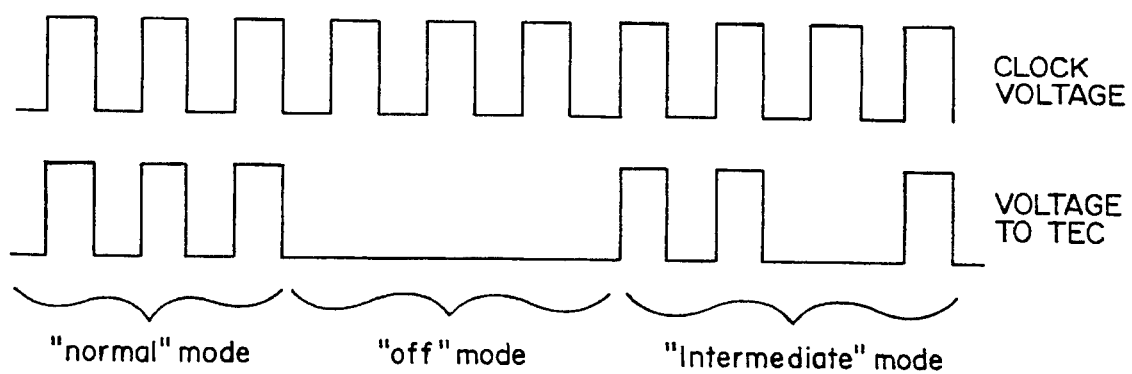
FIGS. 3 shows a clock voltage pulse train.

In a further embodiment, the device of the invention utilizes the clock pulse, a voltage driven off the clock signal, or other similar built-in pulsed voltage to drive the TEC device. Total power to the TEC device is controlled by switching the clock signal on and off during pulses depending on the output from the thermocouple or other control system, including a preprogrammed control. FIG. 3 shows a clock voltage pulse train and a corresponding pulse train taken from the clock pulse with the pulses modified for normal, off and intermediate modes.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A device for maintaining the temperature of an electronic chip at a substantially constant temperature, comprising:

a thermal electric cooling (TEC) device having a hot side and a cold side, said cold side being secured to said electronic chip;

a temperature sensing means having top and bottom sides, said top side being attached to said cold side of said TEC device and said bottom side of said temperature sensing means being attached to said electronic chip for monitoring the temperature of said chip;

heat sink means secured to the hot side of said TEC device; and feedback control circuit means coupled between said temperature sensing means and a voltage source, said feedback control circuit means controlling the level of voltage supplied to said TEC device in response to the temperature of said chip to reduce the temperature of said chip so as to maintain said chip at a substantially constant temperature.

2. The device of claim 1 wherein said temperature sensing device is a thin film thermocouple.

3. The device of claim 1 wherein said temperature sensing device is built into one of a group consisting of the chip and an electronic package to which the chip is attached.

4. The device of claim 1 wherein the TEC device is driven by circuitry built into one of a group consisting of the chip and an electronic package to which the chip is attached.

5. The device of claim 1 wherein said TEC device is driven by turning on and off clock pulses.

6. The device of claim 1 wherein the voltage to the TEC device is preset to a different value for different modes of chip usage.

7. The device of claim 1 wherein said TEC device is secured to said electronic chip and said heat sink by a thermally conductive paste.

8. The device of claim 1 wherein said heat sink means is a multiple fin metallic heat sink.

9. The device of claim 1 wherein said feedback control circuit means is further coupled to a variable speed fan to provide additional cooling in response to the temperature of said chip.

10. A method of maintaining the temperature of an electronic chip at a substantially constant temperature comprising the steps of:

measuring the temperature of said electronic chip by a temperature sensor attached to a top of said chip and to a cold side of a thermal electric cooling (TEC) device, at an interface of the TEC device and the chip;

monitoring the measured temperature of said electronic chip; and controlling a voltage potential applied to said TEC device in response to the monitoring of the temperature of said electronic chip, said TEC device having said electronic chip attached to said cold side of said TEC device and a heat sink attached to a hot side of said TEC device to reduce the temperature of said chip so that the temperature of said chip is maintained at a substantially constant temperature.

11. The method of claim 10 wherein said step of monitoring the temperature of a chip includes feeding a signal from a thermocouple attached to the chip to a feedback control circuit.

12. The method of claim 11 wherein said step of controlling the voltage potential includes regulating a voltage source coupled to said feedback control circuit in response to said signal.

13. The method of claim 10 further including the step of controlling the speed of a variable speed fan in response to the temperature of the chip.

14. A method for maintaining the temperature of an electronic chip at a substantially constant temperature comprising the steps of:

applying a voltage potential to a TEC device based on signals from the chip indicating the level of electrical activity of the chip, where the applied voltage is set to a predetermined value depending on the level of electrical activity of the chip.

* * * * *